United States Patent
Delbo' et al.

(10) Patent No.: US 6,816,019 B2
(45) Date of Patent: Nov. 9, 2004

(54) AUTOMATICALLY CALIBRATED PHASE LOCKED LOOP SYSTEM AND ASSOCIATED METHODS

(75) Inventors: Simona Delbo', I-27047 S. Maria della Versa (PV) (IT); Ernesto Lasalandra, Montù Beccaria (IT); Fabio Pasolini, S. Martino Sicc. (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 42 days.

(21) Appl. No.: 10/174,525

(22) Filed: Jun. 18, 2002

(65) Prior Publication Data

US 2003/0030425 A1 Feb. 13, 2003

(30) Foreign Application Priority Data

Jun. 19, 2001 (IT) .................................... MI2001A1291

(51) Int. Cl.[7] ................................................ H03D 3/09
(52) U.S. Cl. ........................ 331/17; 331/1 A; 327/156
(58) Field of Search .................................. 327/147–152, 327/156–161; 331/11, 17, 1 A, DIG. 2; 375/373–376

(56) References Cited

U.S. PATENT DOCUMENTS

| 5,382,922 A | * | 1/1995 | Gersbach et al. | 331/1 A |
| 5,942,949 A | * | 8/1999 | Wilson et al. | 331/17 |
| 6,229,400 B1 | * | 5/2001 | McCollough et al. | 331/17 |
| 6,552,618 B2 | * | 4/2003 | Nelson et al. | 331/11 |

* cited by examiner

*Primary Examiner*—Minh Nguyen
(74) *Attorney, Agent, or Firm*—Allen, Dyer, Doppelt, Milbrath & Gilchrist, P.A.; Lisa K. Jorgenson

(57) ABSTRACT

A method for automatically calibrating a phase locked loop (PLL) system includes estimating a frequency value of an input signal applied to the system. Based on the estimated frequency value, a driving signal is generated for a plurality of internal switches in the PLL system. A PLL system may also implement this automatic calibration method.

44 Claims, 6 Drawing Sheets

AUTOMATICALLY CALIBRATED PHASE LOCKED LOOP SYSTEM AND ASSOCIATED METHODS

FIELD OF THE INVENTION

The present invention relates to a method of automatically calibrating a phase locked loop (PLL) system, and to a PLL system comprising at least one phase detector cascade connected to a low-pass filter and to a controlled oscillator, as well as to a frequency divider that is feedback connected between the controlled oscillator and the phase detector. The invention relates particularly, but not exclusively, to a method of automatically calibrating a PLL system specifically providing a frequency multiplier function.

BACKGROUND OF THE INVENTION

A phase locked loop or PLL system, diagrammatically shown in FIG. 1, comprises a phase detector PD, a low-pass filter LPF, and a voltage-controlled oscillator VCO cascade connected together between an input terminal IN and an output terminal OUT of the PLL system.

A conventional PLL system also includes a frequency divider DIV, which is feedback connected between the output terminal OUT and the input terminal IN. In particular, the phase detector PD detects a phase difference between first $S_{REF}$ and second $S_{VCO}$ input signals.

The first input signal $S_{REF}$ is an oscillating signal at a reference frequency $F_{REF}$, and the second input signal $S_{VCO}$ is an oscillating signal at a feedback frequency $F_{VCO}$ that is derived from an oscillation output frequency $F_{OUT}$ of an output signal $S_{OUT}$ from the controlled oscillator VCO, as suitably divided within the frequency divider DIV. Since a PLL system operates according to the oscillation frequencies of the signals that flow through it, reference will hereinafter be made to frequencies of interest. These frequencies are the oscillation frequencies of corresponding oscillating signals.

The PLL system shown in FIG. 1 further includes a charge pump phase comparator CPPC connected between the phase detector PD and the low-pass filter LPF. In particular, the charge pump phase comparator CPPC allows a charge stored in a capacitor, provided in the low-pass filter LPF, to be injected, removed, or left unchanged as may be controlled by first UP and second DOWN output signals from the phase detector PD. These output signals UP and DOWN have pulses that are related to the amount of shift that exists between the input frequencies $F_{REF}$ and $F_{VCO}$ to the phase detector PD, as diagrammatically shown in FIG. 2.

The low-pass filter LPF is used to extract an average value from an output voltage signal $V_{LPF}$ from the charge pump phase comparator CPPC. This is done so that a voltage signal $V_{VCO}$ can be input to the controlled oscillator VCO and a desired frequency can be obtained.

To further clarify operation of the PLL system, reference will now be made to FIG. 3, which shows a portion of the PLL system of FIG. 1 in greater detail. In particular, FIG. 3 shows a circuit structure 1, which corresponds to a combination of the charge pump phase comparator CPPC, the low-pass filter LPF, and the controlled oscillator VCO in the PLL system of FIG. 1.

The circuit structure 1 comprises an operational amplifier 2 having a first input terminal IN1 connected to a first internal circuit node X1 of the circuit structure 1. This node is connected to a supply voltage reference Vcc through a control resistive element $R_{VCO}$. A second input terminal IN2 is connected to a second internal circuit node X2. More specifically, this node is intermediate first G1 and second G2 generators supplying a reference current Iref. These generators are connected in series with each other between the supply voltage reference Vcc and a second voltage reference. The second voltage reference is specifically a ground reference GND. The circuit structure 1 further includes an output terminal OUT1 connected to a control terminal of an output transistor $M_{OUT}$. The output transistor $M_{OUT}$ is connected between the first internal circuit node X1 and the controlled oscillator VCO.

The first and second generators G1 and G2 are connected to the second internal circuit node X2 through first SW1 and second SW2 electronic switches that are respectively driven by the output signals UP and DOWN from the phase detector PD. The output transistor $M_{OUT}$ drives the controlled oscillator VCO by supplying it with a regulating current $I_{VCO}$.

The circuit structure 1 additionally comprises a first filtering capacitor Cf1 and a filtering resistive element Rf, which are connected in series with each other, between the second input terminal IN2 of the operational amplifier 2 and ground GND. A second filtering capacitor Cf2 is connected to a point intermediate the first filtering capacitor Cf1 and the filtering resistive element Rf, as well as to ground GND.

The size of the low-pass filter LPF is set by adjustment of the values of the first and second capacitors Cf1 and Cf2, and the value of the filtering resistive element Rf. In particular, to obtain a damping factor (which is one of the characterizing parameters of a system dynamic response) such that the transient of the PLL system can be fast and does not show any overshoots, filter elements can be used that have the following values: Cf1=1 nF; Rf=76 kΩ; and Cf2=200 pF.

In this way, a damping factor of approximately 0.7 is obtained. This is regarded as an optimum value for closed-loop systems. Because of its size, the first filtering capacitor Cf1 cannot be integrated to the remainder of the PLL system, and is provided externally. The second filtering capacitor Cf2 reduces spikes in the control voltage $V_{LPF}$ waveform at the second internal circuit node X2. The spikes originate from switching of the switches SW1 and SW2.

The output voltage $V_{VCO}$ from the low-pass filter LPF controls the regulating current $I_{VCO}$ to the controlled oscillator VCO. This is done through the regulating resistive element $R_{VCO}$ connected between the supply voltage reference Vcc and the first internal circuit node X1.

It is readily known that a voltage controlled oscillator VCO can be formed by a series of variable-current inverters connected into a loop and having capacitors interposed therebetween. The VCO outputs a signal $S_{OUT}$ whose oscillation frequency $F_{OUT}$ is tied to the input current $I_{VCO}$.

The operation of the subject PLL system will be better explained by considering the illustrative case of a pulse in the first output signal UP received at a given time from the phase detector PD. This implies that the feedback frequency $F_{VCO}$ from the frequency divider DIV is late on the reference frequency $F_{REF}$. In this case, the charge pump phase comparator CPPC will respond by closing the second switch SW2 to ground GND. This causes the charge stored in the first filtering capacitor Cf1 to be diminished.

In this way, an increase in the input current $I_{VCO}$ to the controlled oscillator VCO is obtained, which produces an increase in the output frequency $F_{OUT}$, and accordingly, brings the feedback frequency $F_{VCO}$ back into phase with the reference frequency $F_{REF}$. The frequency divider DIV in the feedback leg turns the PLL system into a frequency multiplier by a multiplication factor N. In several applications, e.g., hard-disk noise compensation using an accelerometer and feed-forward compensation techniques, the multiplication factor N to be used is fairly large, and the operating frequency range that is possible for the PLL system becomes wide.

By way of example and not to be a limitation, in case of a hard-disk control, the frequency values and multiplication factors may be: $F_{REF}$: 5 to 30 kHz; and $F_{CVO}$: 1.12 to 6.72 MHz with N=224. Setting such values makes for more complicated sizing of the PLL system components. In particular, to obtain all the desired frequencies, the input current $I_{VCO}$ to the controlled oscillator VCO is forced to values that are incompatible with the current values through the remainder of the PLL system.

It can be shown that the following relation applies to a PLL system like that illustrated by FIGS. 1 and 3:

$$\frac{F_{VCO}}{F_{REF}} = \frac{(1 + sRfCf1)}{1 + sRfC1 + \frac{s^2 Cf1 R_{VCO}}{KdK_{VCO}}} \quad (1)$$

where $$Kd = \frac{Irif}{2\pi},$$

and Irif is the current from the generators G1 and G2. The calibration parameters for the PLL system can be obtained from relation (1) above, as follows:

$$\omega_n = \sqrt{\frac{Irif}{Cf1R_{VCO}} \frac{K_{VCO}}{2\pi N}} \quad (2)$$

$$\xi = \frac{\omega_n RfCf1}{2} \quad (3)$$

where $K_{VCO} * I_{VCO}$ is the transfer function of the controlled oscillator VCO.

In a real application, all of the parameters found would be subject to appropriate specifications. In particular, the following set of conditions is obtained:

$$\left. \begin{array}{l} \omega_n = \sqrt{\frac{Irif}{CfR_{VCO}} \frac{K_{VCO}}{2\pi N}} = 21 \frac{Krad}{s} \\ \zeta = \frac{\omega_n RfCf1}{2} = 0.7 \\ 1 < V_{X1} < 4V \\ K_{VCO} = 2.9E^{10} H \frac{Hz}{A} \end{array} \right\} \Leftrightarrow \left( \begin{array}{l} Irif = 150 \text{ uA} \\ Cf1 = 1 \text{ nF} \\ Rf = 76 \text{ k}\Omega \\ R_{VCO} = 7 \text{ k}\Omega \end{array} \right) \quad (4)$$

wherein the value of a voltage $V_{X1}$ at the first internal circuit node X1 is enforced by the need to have the low-pass filter LPF correctly biased. This is also in view of the fact that values below the lowest limit and above the highest limit can be reached during the transient. The value of $K_{VCO}$ is a design setting based on a relation $K_{VCO}=S_{OUT}/I_{VCO}$.

At a value of $\omega_n$ equal to 21 Krad/s (which is a plausible value in applications such as those under consideration), and a resistance $R_{VCO}$ of 7 k$\Omega$, the following approaches are obtained in the frequency range sought: at $F_{REF}$=30 kHz, and $I_{VCO}=(F_{OUT}/K_{VCO})$=231 uA. Therefore, $V_{X1}$=3.38V within the above set limits, however: at $F_{REF}$=5 kHz, and $I_{VCO}=(F_{OUT}/K_{VCO})$=38 uA. Therefore, $V_{X1}$=4.73V is outside the above set limits.

Thus, at the frequency range of interest, the values found for the voltage $V_{X1}$ fall outside the limits set by the above relation (4). It should be noted that, not even by reducing the value of $\omega_n$ down to 15 Krad/s (thus restricting the overall system performance), and accordingly using a resistance $R_{VCO}$ of 21 k$\Omega$, can values of the control voltage $V_{VCO}$ be obtained within the allowed range. In particular, at $F_{REF}$=30 kHz, $I_{VCO}=(F_{OUT}/K_{VCO})$=231 uA. Therefore, $V_{X1}$=0.15V is outside the set limits, and at $F_{REF}$=5 kHz, $I_{VCO}=(F_{OUT}/K_{VCO})$=38 uA. Therefore, $V_{X1}$=4.2V, is also outside the set limits.

Thus, with a traditional PLL system, no correct value of the control resistive element $R_{VCO}$ can be obtained within the operating frequency range of the PLL system. In addition, the assumed frequency range (5 to 30 kHz) is bound to be extended in future applications involving higher and higher performance levels.

The above-outlined approach is made worse by the fact that the operating frequency range is extended as the multiplication factor N of the PLL system varies. An external element may be provided for selecting each time the reference frequency range that is to be used, thereby calibrating the PLL system. For example, U.S. Pat. No. 6,057,739 to Crowly et al. discloses a PLL system that includes a register whose bits are used to vary the system parameters, and accordingly, the operating range. It should be noted, however, that the write operation into the register is performed externally, and thus it is not automatic.

SUMMARY OF THE INVENTION

The underlying technical problem of this invention is to provide a method of automatically calibrating a PLL system such that the PLL system can automatically match any range of operating frequencies, thereby overcoming the limitations and obviating the drawbacks of known PLL systems.

In view of the foregoing background, an object of the present invention is to provide a method of automatically calibrating a PLL system from an estimate of a frequency value of an input signal. The signal is effective to suitably drive switching means provided within the PLL system.

This and other objects, advantages and features in accordance with the present invention are provided by a method of automatically calibrating a phase locked loop (PLL) system comprising the steps of estimating a frequency value of an input signal to the system. Based on the estimated frequency value, a driving signal is generated for a plurality of internal switches provided within the system. The method further includes calibrating the system using the plurality of internal switches driven by the driving signal.

Another aspect of the present invention is directed to a phase locked loop system comprising at least one phase detector cascade connected to a low-pass filter, and to a controlled oscillator. A frequency divider is feedback connected between an output terminal and an input terminal of the PLL system.

The PLL system further comprises an automatic frequency range selecting device connected between the input terminal and an output of the controlled oscillator, and includes at least one controlled variable element connected to a control circuit. The control circuit generates, from a frequency estimate of an input signal presented on the input terminal, a driving signal of the controlled variable element, thereby calibrating the PLL system and automatically matching the system operation to the frequency range of the input signal.

BRIEF DESCRIPTION OF THE DRAWINGS

The features and advantages of the automatic calibrating method and the PLL system according to the invention will appear from the following description of an embodiment thereof, given by way of an example and not to be limited with reference to the accompanying drawings. In the drawings.

DETAILED DESCRIPTION OF THE PREFERRED EMBODIMENTS

Figure 1:
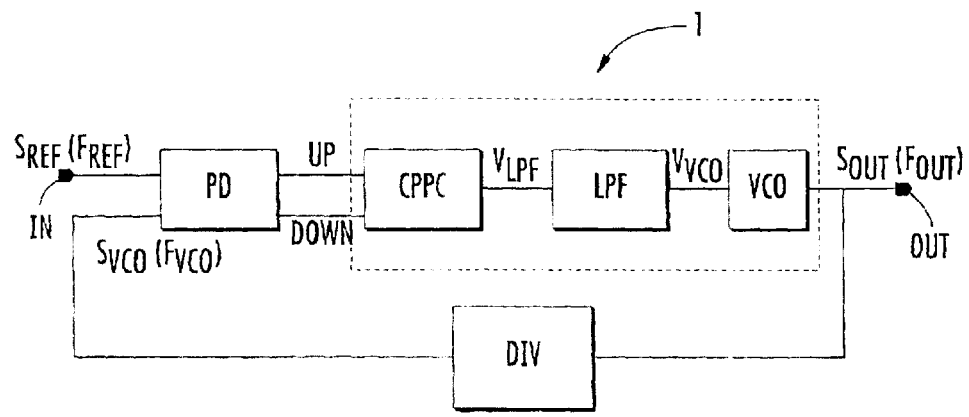
FIG. 1 diagrammatically shows a PLL system according to the prior art.
Figure 2:
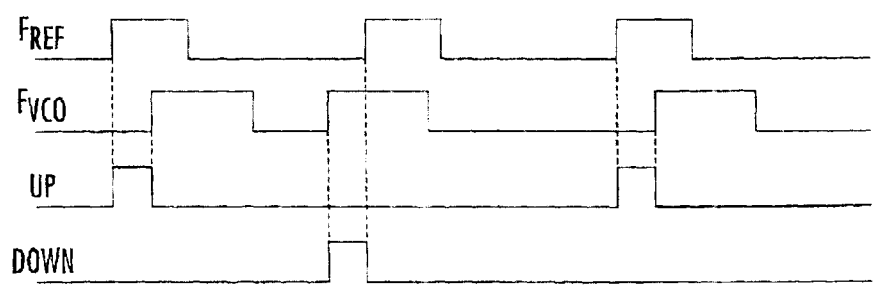
FIG. 2 diagrammatically shows the pattern of some internal signals of the PLL system of FIG. 1.
Figure 3:
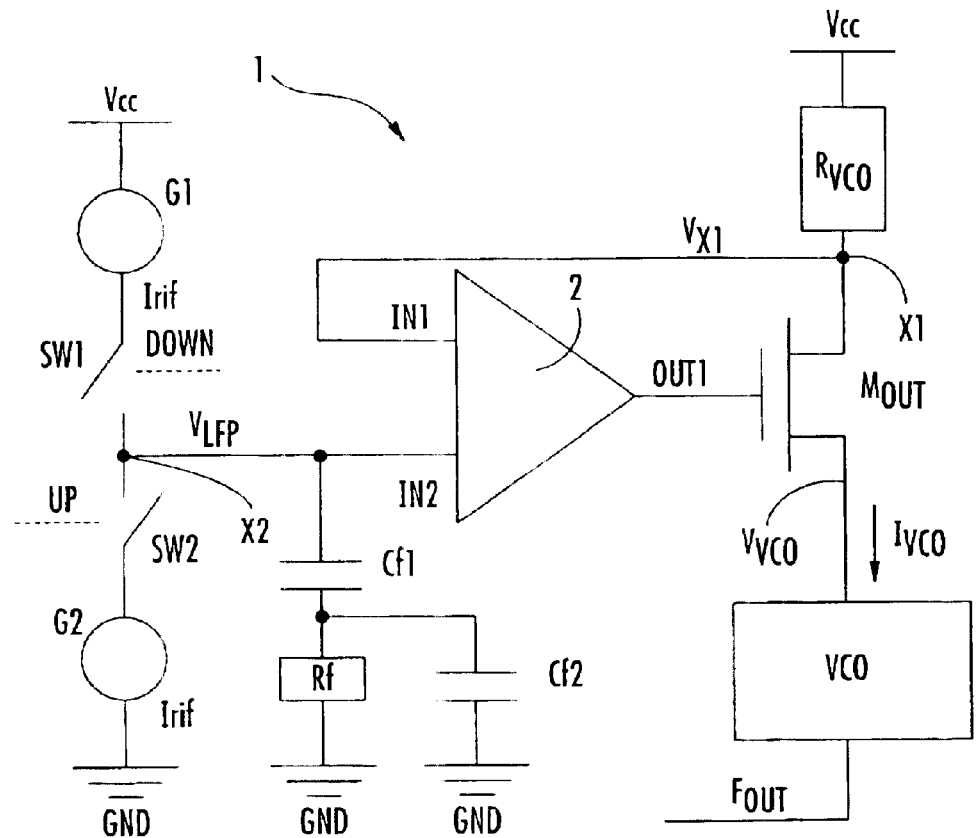
FIG. 3 is a more detailed view of the PLL system shown in FIG. 1.

The present invention relates to a PLL system having the same basic construction as the prior art PLL system previously described in relation to FIGS. 2 and 3. The latter system will be referred to by the same references to identify elements that are identical in both systems. Thus, the PLL system according to the invention comprises the following blocks: a phase detector PD, a low-pass filter LPF, a controlled oscillator VCO, and a frequency divider DIV. The frequency divider is feedback connected between the input and the output of the PLL system to cause it to operate as a frequency multiplier.

The PLL system has the internal circuit construction shown in FIG. 3, and accordingly, obeys Equations (1), (2) and (3) above. In addition, for the PLL system according to the invention to perform as expected through a wide frequency range, a set of conditions must be met. This set of conditions is much like the set of conditions (4) previously discussed in connection with a practical example with reference to prior art approaches.

Figure 4:
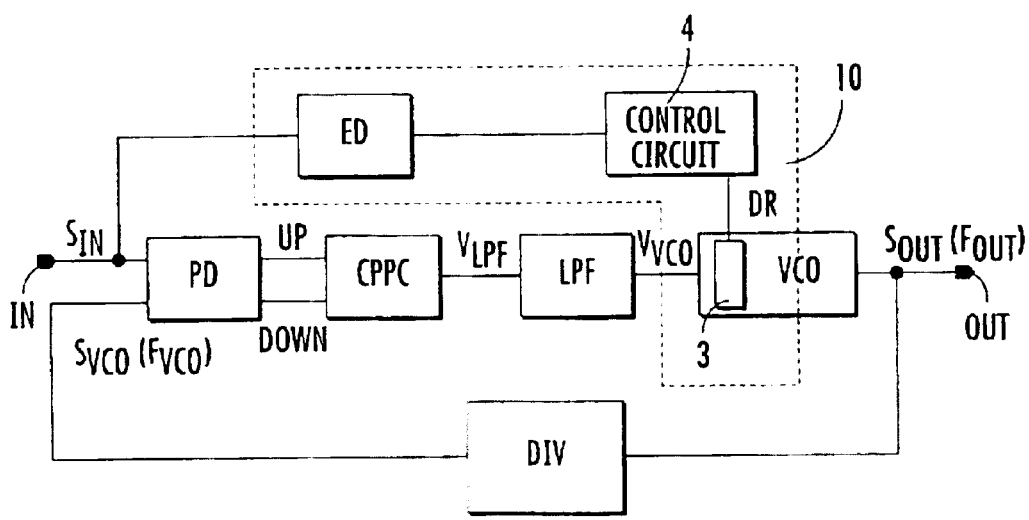
FIG. 4 diagrammatically shows a PLL system that incorporates an automatic selection device implementing the automatic calibration method according to the present invention.

Advantageously, the PLL system according to the invention comprises an automatic selection device 10 of a suitable frequency range to automatically calibrate the PLL system, as shown schematically in FIG. 4. In particular, the automatic selection device 10 comprises a variable element 3 incorporated into the controlled oscillator VCO. The variable element 3 is controlled by a driving signal DR from a control circuit 4, which in turn is connected to an edge detector ED that receives an input signal $S_{IN}$ applied to the PLL system.

Advantageously, generating the driving signal DR according to the invention is related to an estimate of the frequency of the input signal to the PLL system obtained from a signal that marks the rising/falling edges of the input signal. In particular, the automatic calibrating method of a PLL system according to the invention comprises estimating the frequency value of an input signal $S_{IN}$ to the PLL system. Based on the estimated frequency value, a driving signal DR is generated for a plurality of internal switches of the PLL system. The internal switches are used for calibrating the PLL system, and specifically, by adjustment of internal parameters that are related to its transfer function.

Embodiments of a PLL system incorporating an automatic selection device 10 according to the invention will now be described for a better appreciation of the automatic calibrating method of a PLL system. As shown schematically in FIG. 4, the automatic selection device 10 is input the signal $S_{IN}$, and outputs a driving signal DR to a controlled variable element 3 incorporated into the PLL system. This is for automatically adjusting internal parameters of the PLL system that are related to the transfer function of the PLL system. In this way, the PLL system operation is automatically matched to the frequency range of the input signal $S_{IN}$, and the conditions (4) for proper performance of the PLL system are met.

In particular, the automatic selection device 10 includes a rising/falling edge detector ED, which receives the input signal $S_{IN}$ and has its output connected to a control circuit 4. The edge detector ED is basically used for detecting the rising/falling edges of the input signals from which the control circuit 4 can estimate the frequency of the input signal $S_{IN}$.

The control circuit 4 has its output connected to a controlled variable element 3 that is internal of the PLL system. In particular, the control circuit 4 generates a driving signal DR to the controlled variable element 3 which is related to the frequency of the input signal $S_{IN}$.

Thus, the automatic selection device 10 implementing the automatic calibration method according to the invention provides for a conversion of an estimate of a frequency of the input signal $S_{IN}$ into the driving signal DR that will drive an internal variable element of the PLL system to adjust the system operating parameters. The controlled variable element 3 comprises at least first and second elements connected in series with each other. At least one of these elements has a switching device connected across it that is controlled by the driving signal DR from the control circuit 4.

Figure 5:
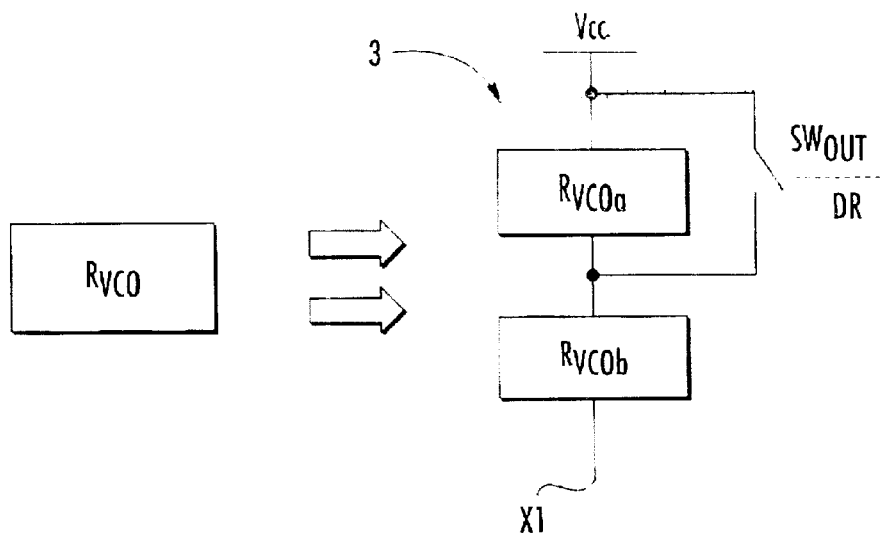
FIG. 5 diagrammatically shows a controlled variable element incorporated into the automatic selection device of FIG. 4.
Figure 6:
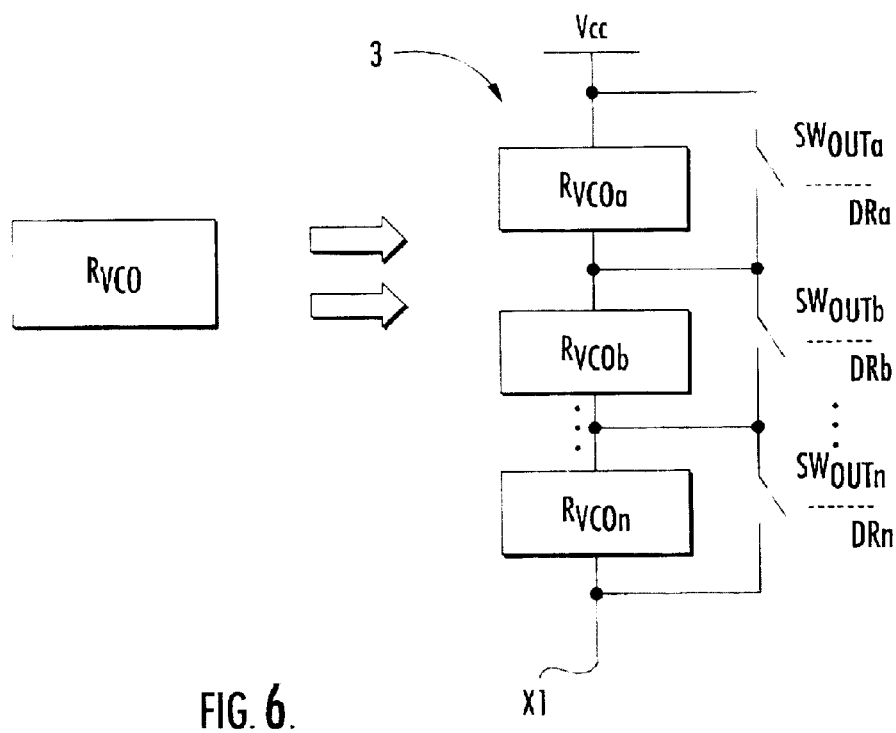
FIG. 6 diagrammatically shows a modified embodiment of the controlled variable element of FIG. 5.

In particular, the controlled variable element 3 comprises, in the embodiments shown in FIGS. 5 and 6, at least one complex resistive element including a plurality of resistive elements connected in series together. At least one of these resistive elements has its terminals connected to an electronic switch.

The controlled variable element 3 takes the place of the control resistive element $R_{VCO}$ in the PLL system. Advantageously, the controlled variable element 3 will, therefore, be acting on a value of current by suitably selecting resistors, with the voltage across it being set by the circuitry provided downstream of it. Furthermore, the resistors are selected by an appropriate driving signal that is derived from an estimate of frequency of the input signal $S_{IN}$ to the PLL system.

In particular, a first embodiment of the controlled variable element 3, which replaces the control resistive element $R_{VCO}$ and is schematically shown in FIG. 5, comprises first $R_{VCOa}$ and second $R_{VCOb}$ resistive elements that are connected in series with each other between the supply voltage reference Vcc and the first internal circuit node X1.

The controlled variable element 3 further comprises an electronic switch $SW_{OUT}$, which may be connected across the first resistive element $R_{VCOa}$, for example. The electronic switch $SW_{OUT}$ is driven by the driving signal DR provided by the control circuit 4.

Advantageously, the driving signal DR allows the resistance of the controlled variable element 3 to be selected by shorting one of the two resistive elements as the electronic switch $SW_{OUT}$ is closed. The values of the resistive elements are suitably computed from a known gain value of the controlled oscillator VCO, and from the desired range of operating frequencies.

Thus, with the aid of the driving signal DR that has been derived from an estimate of the input signal frequency provided by the control circuit 4, either resistive element $R_{VCOa}$ or $R_{VCOb}$ can be chosen to ensure proper operation of the PLL system. Assuming an application to a hard-disk controller as previously considered in connection with the prior art, the following would be likely values: $R_{VCOa}$=28 k$\Omega$, and $R_{VCOb}$=7 k$\Omega$.

In this way, operating frequencies of 5 kHz to 30 kHz are allowed for the input signal $S_{IN}$ along with a multiplication factor of 224. In particular, at frequency values in excess of 10 kHz, the electronic switch $SW_{OUT}$ would be closed and the value of equivalent resistance of the automatic selection device 3 equals the value of the second resistive element $R_{VCOb}$. At lower frequency values, the electronic switch $SW_{OUT}$ would open and the value of equivalent resistance of the automatic selection device 3 equals the sum of the values of the resistive elements $R_{VCOb}+R_{VCOa}$.

The automatic calibration method according to the invention could be generalized by using a number of threshold values, and therefore, a number of sub-sets of frequency ranges. In this way, multiplication factors N significantly differing from one another could be set.

In this generalized version of the automatic calibration method according to the invention, the multiplication factor would be taken into account to generate the driving signal DR to the electronic switches and accordingly change the resistance value of the controlled variable element 3.

In particular, as shown schematically in FIG. 6, the controlled variable element 3 according to the invention would then comprise a plurality of resistive elements RVCOa, RVCOb, . . . , RVCOn, all connected together in series between the supply voltage reference Vcc and the first internal circuit node X1, as well as a plurality of electronic switches $SW_{OUTa}$, $SW_{OUTb}$, . . . , $SW_{OUTn}$. Each switch is connected across a respective one of the resistive elements RVCOa, RVCOb, . . . , RVCOn and is driven by a respective driving signal DRa, DRb, . . . , DRn.

Advantageously, the driving signals DRa, DRb, . . . , DRn would be obtained by combining the driving signal DR provided from the control system 4 with the multiplication factor N required by the PLL system. In particular, the driving signal DR would be combined with the output from a computing block of the multiplication factor as set. This may be done by taking the most significant bits into account, for example.

In other words, the controlled variable element 3 comprises a resistive network by which a range of equivalent resistance values can be obtained that also takes the value of the PLL system multiplication factor N into account. Alternatively, the required plurality of driving signals could be obtained from a multi-level decider, i.e., from a comparator adapted to discriminate a plurality of thresholds and allow a driving signal DR to be obtained at several levels.

Figure 7:
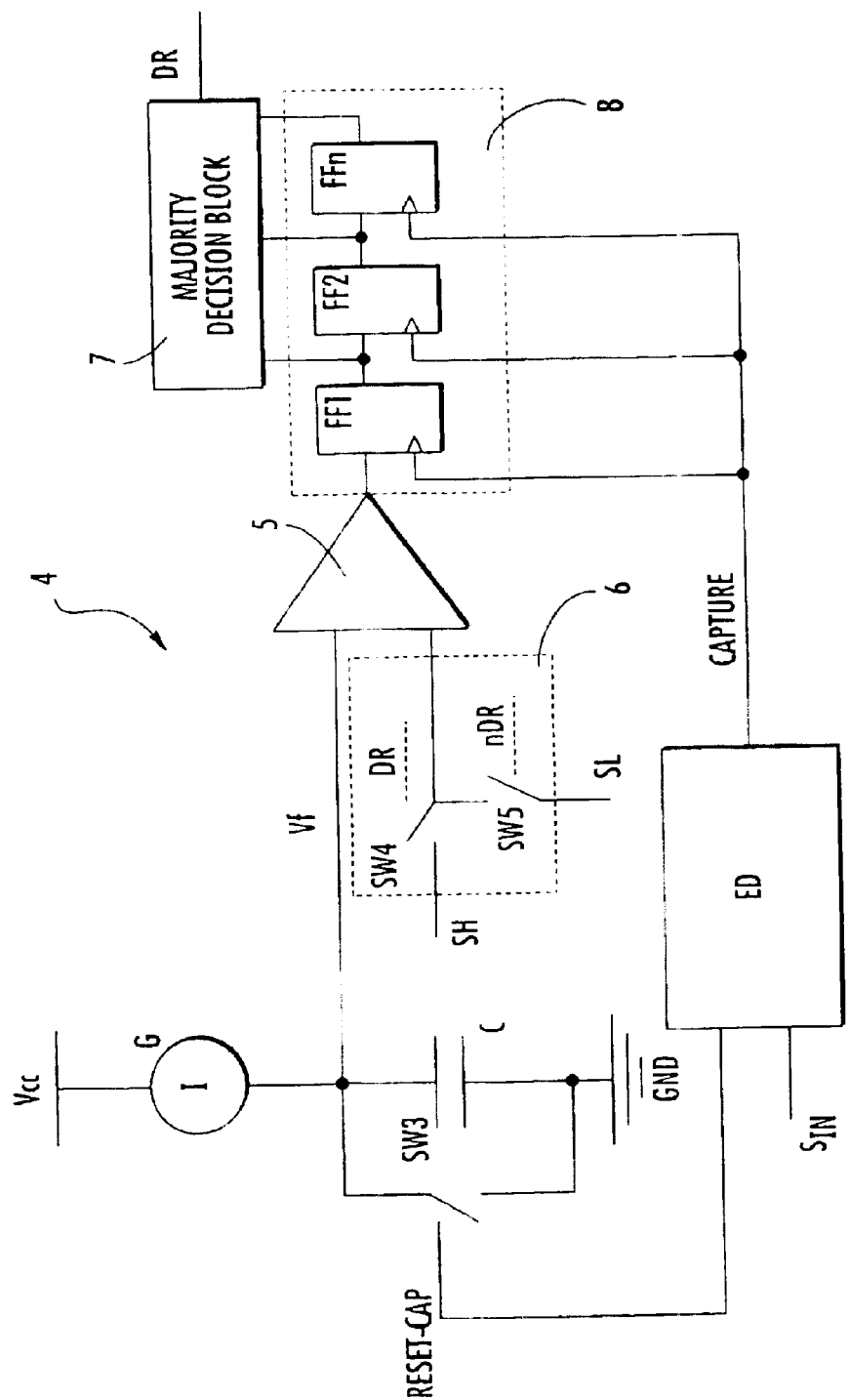
FIG. 7 diagrammatically shows a control circuit incorporated into the automatic selection device of FIG. 4.

Advantageously, the driving signal DR is obtained from an input control circuit 4, as schematically shown in FIG. 7. The control circuit 4 is input, through the edge detector ED, with a set signal RESET-CAP indicating the rising/falling edges of the input signal $S_{IN}$, and outputs the driving signal DR to the electronic switches $SW_{OUT}$.

In particular, the control circuit 4 has its input connected to a generator G that generates a reference current I, and to a sense capacitor C. The generator and capacitor are connected between the supply voltage reference Vcc and ground GND. The sense capacitor C has an electronic switch SW3 connected across it. This switch SW3 is driven by the set signal RESET-CAP.

In this way, to evaluate the frequency of the input signal, the capacitor C is reset at the rising/falling edges as detected by the edge detector ED (signal RESET-CAP), and is charged by the reference current I. The voltage Vf across the capacitor increases in time between a rising/falling edge and the next. The final value across the capacitor C is therefore indicative of the input signal frequency.

In other words, the control circuit 4 provides for a conversion of the frequency of the input signal $S_{IN}$, which is not immediately available, into a comparable parameter, specifically a voltage value Vf. It could also be arranged for a counter to count the pulses of a reference clock signal. The counter is reset by the rising/falling edges of the input signal $S_{IN}$. Thus, the clock pulse count between a rising/falling edge and the next would also provide a comparable parameter indicating the frequency of the input signal $S_{IN}$.

The control circuit 4 further comprises a comparator 5, which has a first input terminal connected to one end of the sense capacitor C and has a second input terminal connected to a threshold selector 6. The threshold selector 6 has a first input terminal to receive a first threshold value, specifically a high threshold SH, and has a second input terminal to receive a second threshold value, specifically a low threshold SL.

The input terminals of the threshold selector 6 are connected to the second input terminal of the comparator 5 through first and second electronic switches SW4 and SW5 which are driven by the driving signal DR and its opposite nDR. Furthermore, the comparator 5 has an output terminal connected to a majority decision block 7 through a signal sampler 8. The signal sample 8 samples the output signal from the comparator 5, and is set by a signal CAPTURE provided by the edge detector ED.

The majority decision block 7 outputs the driving signal DR to the electronic switches that are driven from the controlled variable element 3. In particular, the sampler 8 comprises cascaded flip-flops FF1, . . . , FFn that are input a signal $S_{OUT5}$ from the comparator 5 and receives the signal CAPTURE at a set terminal.

Figure 8:
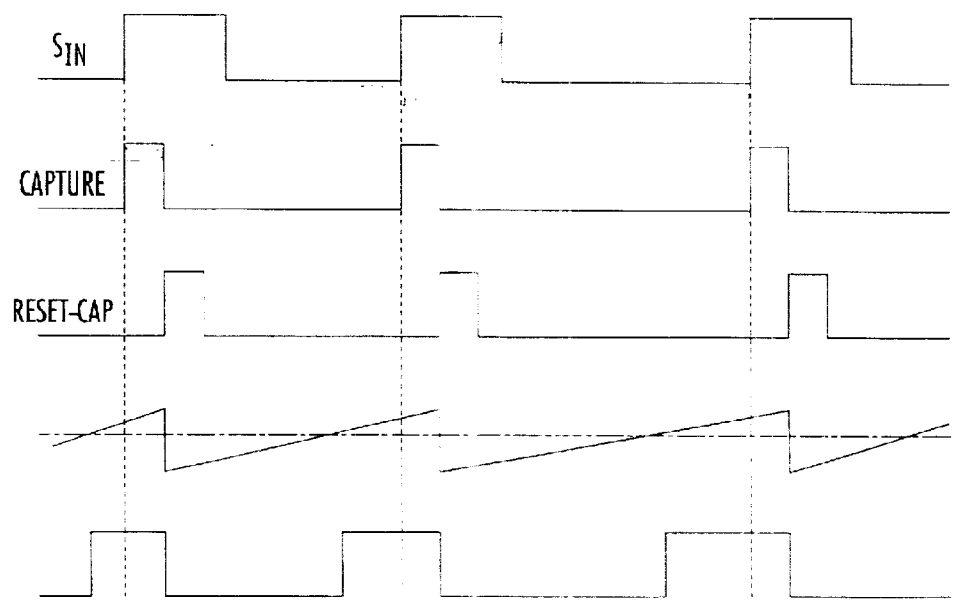
FIG. 8 shows the pattern of internal signals of the control circuit of FIG. 7.

The operation of the control circuit 4 according to the invention will now be described. The edge detector ED senses the rising/falling edges of the input signal $S_{IN}$ and generates the set signal RESET-CAP to open the switch SW3 and allow the current I, of about 1 uA, to charge the sense capacitor C (~50 pF) between two consecutive rising edges of the input signal $S_{IN}$. In this way, a voltage Vf is obtained across the capacitor C. This voltage is input to the comparator 5, such as a voltage Vf having a saw-tooth pattern as shown schematically in FIG. 8.

The value of the voltage Vf across the sense capacitor C is then compared with appropriate high and low threshold values SH and SL. In particular, the control circuit 4 provides for a conversion of the frequency of the input signal $S_{IN}$ into the voltage Vf, and outputs the driving signal DR after comparing the voltage Vf with appropriate threshold values SL, SH.

It should be noted that these threshold values are computed within the set conditions (4) for the PLL system, as previously discussed in connection with the prior art. In particular, the following would be suitable high and low threshold values in the exemplary application under consideration: SH=1.3 V, and SL=1.1 V.

The threshold values SH and SL means that the comparator 5 will exhibit some kind of hysteresis. In this way, the frequency range being input to the control system 4 is split into two sub-ranges, with each sub-range having distinctive high and low threshold values. These sub-ranges can partly overlap, thereby preventing sign reversals from occurring unceasingly in the comparator 4 as the voltage Vf across the sense capacitor C approaches the threshold.

Also in the illustrative hard-disk controller application considered, the two frequency sub-ranges overlap at respective resistance values of 18 kΩ and 7 kΩ of the resistive elements $R_{VCOa}$ and $R_{VCOb}$. In particular, a first frequency sub-range of 5 kHz to 19 kHz and a second frequency range of 15 kHz to 30 kHz are obtained. These sub-ranges would overlap in the 15 kHz to 19 kHz band.

It should be noted that, in this way, the overall robustness of the PLL system is improved. In fact, in the instance of a single threshold value, so that there would be no frequency overlapping, undesired switchings of the driving signal DR may occur at frequencies close to the threshold value. These undesired switchings are suppressed by frequency sub-ranges that overlap each other.

In addition, compensation for any processing spread that would produce variations in the values specified for the current I and sense capacitor C is achieved. The majority decision block 7 is next to the comparator 5 to make a majority decision over three consecutive values as they are issuing from the sampler 8, i.e., to validate the decision of comparator 5 if this appears twice over the three consecutive values. This prevents small variations in the input signal $S_{IN}$ (as due to jitter/noise effects on the input signal $S_{IN}$, for example) from too significantly affecting the overall performance of the control system 4.

To summarize, the frequency-to-voltage conversion provided by the control system 4 allows, through a change in the resistance $R_{VCO}$, the parameter $\omega_n$ in the set (4) of conditions to be changed automatically on the basis of the estimated frequency value, thereby to adjust the frequency response of the PLL system.

Using the electronic switch $SW_{OUT}$ of the controlled variable element 3, a suitable value for the control resistive element $R_{VCO}$ of the controlled oscillator VCO is then selected starting from the estimated frequency value to automatically calibrate the PLL system. The change in the internal resistive element $R_{VCO}$ of the controlled oscillator VCO, along with the corresponding change in the parameter $\omega_n$, influences the performance of the filter LPF, especially the parameter $\xi$ thereof.

Figure 9:
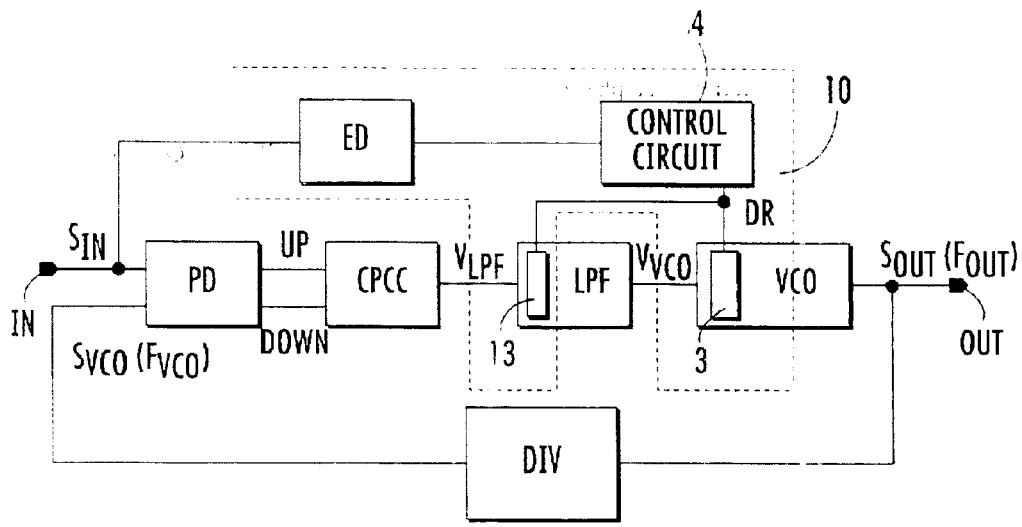
FIG. 9 diagrammatically shows a modified embodiment of the PLL system incorporating the automatic selection device according to the present invention.
Figure 10:
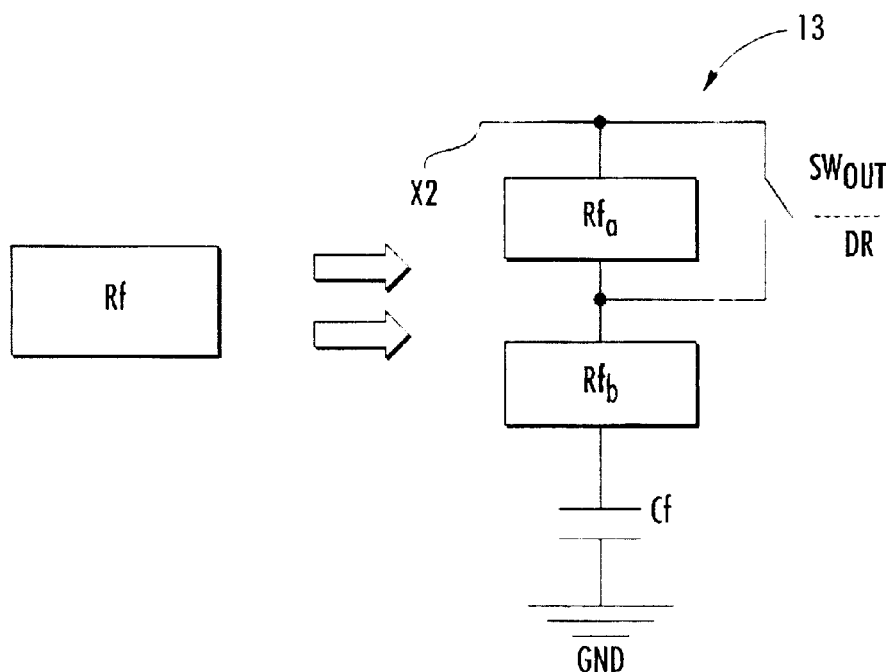
FIG. 10 diagrammatically shows an additional controlled variable element incorporated into the modified embodiment of FIG. 9.

Advantageously, another controlled variable element 13 is added to the automatic selection device 10, as shown schematically in FIG. 9. In particular, the PLL system of FIG. 9 comprises an additional controlled variable element 13 in place of the filtering resistive element Rf within the low-pass filter LPF.

To keep the performance of the low-pass filter LPF at an optimum level, the additional controlled variable element 13 is driven by the same driving signal DR as the internal controlled variable element 3 of the controlled oscillator VCO. In particular, the additional controlled variable element 13 comprises first and second resistive elements $Rf_a$ and $Rf_b$, which are connected in series with each other between the second internal circuit node X2 and the filtering capacitor Cf. The filtering capacitor Cf is connected to ground GND.

In a general way, it becomes possible, based on the estimated frequency value of the input signal $S_{IN}$, to alter the values of other PLL system parameters in an appropriate and automatic manner. In particular, in a modified embodiment shown schematically in FIG. 11, the driving signal DR provided by the control system 4 is utilized to select from a plurality of capacitors rather than from a plurality of resistive elements, for use in the controlled oscillator VCO.

Figure 11:
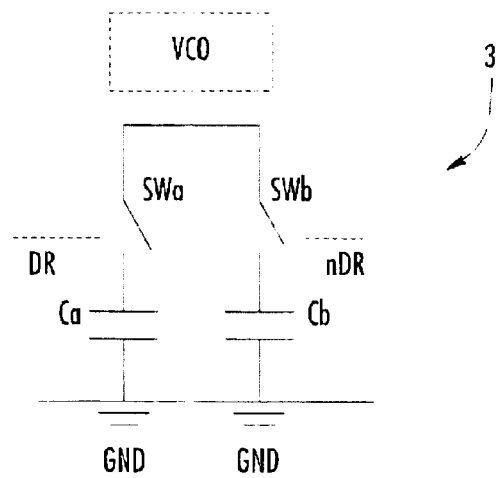
FIG. 11 shows a further modified embodiment of the controlled variable element incorporated into the automatic selection device according to the present invention.

In particular, a controlled variable element 3 implementing the automatic calibration method according to the invention is shown in FIG. 11. This element comprises at least first and second capacitors Ca and Cb connected to the remainder of the controlled oscillator VCO circuitry through first and second electronic switches SWa and SWb being driven by the driving signal DR and its opposite nDR, respectively.

The driving signal DR (and its opposite nDR) is used to set the capacitance value of the capacitor incorporated to the controlled oscillator VCO, and therefore, to automatically vary the transfer function of the host PLL system according to the input frequency as estimated by the control system 4. In particular, the values of these capacitors are related to the value of $\omega_n$, since they enter in the computing of the constant $K_{VCO}$.

It should be understood that modifications, integrations and substitutions of parts may be made for the embodiments of the automatic selection device 10 described above by way of example and which is not to be limited. The automatic selection device 10 is but one that can implement this method of automatically calibrating a PLL system, as the method is a comprehensive one not bounded uniquely to this form. For instance, the automatic calibration method according to the invention could use the driving signal DR from the control system 4 in a related manner to the input signal $S_{IN}$ to decide whether a fixed current should be removed from the current to the controlled oscillator VCO.

That which is claimed is:

1. A phase-locked loop (PLL) system comprising:
   at least one phase detector;
   a low-pass filter connected to said at least one phase detector;
   a controlled oscillator connected to said low-pass filter;
   a frequency divider connected between an output of said controlled oscillator and a first input of said at least one phase detector; and
   an automatic frequency range selection device connected between said controlled oscillator and a second input of said at least one phase detector without being connected to said frequency divider, said automatic frequency range selection device comprising
   at least one variable element, and
   a control circuit connected to said at least one variable element for generating a driving signal based upon a frequency estimate of an input signal applied to the second input of said at least one phase detector, the driving signal for calibrating the PLL system and for matching operation of the PLL system to a frequency range of the input signal.

2. A PLL system according to claim 1, wherein said automatic frequency range selection device further comprises a rising/falling edge detector having an input connected to the second input of said at least one phase detector for receiving the input signal, and an output connected to said control circuit.

3. A PLL system according to claim 2, wherein said control circuit provides the driving signal to said at least one variable element based upon said rising/falling edge detector receiving the input signal.

4. A PLL system according to claim 3, wherein said rising/falling edge detector provides a set signal to said control circuit for indicating rising/falling edges of the input signal.

5. A PLL system according to claim 4, wherein said control circuit comprises:
  a generator connected to a first voltage reference for generating a reference current;
  a sense capacitor connected between said generator and a second voltage reference; and
  an electronic switch connected across said sense capacitor and being driven by the set signal.

6. A PLL system according to claim 5, wherein said sense capacitor is discharged by the set signal at the rising/falling edges of the input signal and is charged by the reference current, whereby a frequency of the input signal is indicated by a voltage across said sense capacitor.

7. A PLL system according to claim 6, wherein said control circuit comprises a clock pulse counter that is reset by the set signal at the rising/falling edges of the input signal, and a frequency of the input signal is indicated by a number of clock pulses counted by said counter.

8. A PLL system according to claim 5, wherein said control circuit further comprises:
  a comparator having a first input connected to said sense capacitor;
  a threshold selector connected to a second input of said comparator and comprising first and second switches, said threshold selector having a first input for receiving a first threshold via said first switch and a second input for receiving a second threshold via said second switch, the first switch being driven by the driving signal and the second switch being driven by an inverse of the driving signal.

9. A PLL system according to claim 8, wherein said control circuit further comprises:
  a sampler circuit connected to an output of said comparator and being driven by a signal provided by said rising/falling edge detector; and
  a majority decision block connected to said sampler circuit for providing the driving signal to said at least one variable element.

10. A PLL system according to claim 9, wherein said sampler circuit comprises a plurality of cascaded flip-flops receiving an output signal from said comparator, and receiving at a set terminal the signal provided by said rising/falling edge detector.

11. A PLL system according to claim 8, wherein said comparator comprises a hysteresis comparator.

12. A PLL system according to claim 1, wherein said at least one variable element comprises:
  a switching device being driven by the driving signal; and
  at least one complex resistive element comprising a plurality of resistive elements connected in series, and at least one of said resistive elements has its terminals connected to said switching device.

13. A PLL system according to claim 1, wherein the driving signal as generated by converting a frequency of the input signal to a voltage, and comparing the voltage with at least one threshold from a signal indicating rising/falling edges of the input signal.

14. A PLL system according to claim 1, further comprising an output transistor connected between said controlled oscillator and said at least one variable element; and wherein said at least one variable element comprises:
  first and second resistive elements connected in series between a voltage reference and said output transistor; and
  a switching device connected across one of said first and second resistive elements and being driven by the driving signal for selecting a resistance of at said at least one variable element by shorting one of said first and second resistive elements based upon said switching device being closed.

15. A PLL system according to claim 1, wherein said at least one variable element comprises an additional variable element defining a filtering resistive element in said low-pass filter.

16. A PLL system according to claim 15, wherein said additional variable element is driven by the driving signal.

17. A PLL system according to claim 15, wherein said additional variable element comprises:
  first and second filtering resistive elements connected in series; and
  a switching device connected across one of said first and second filtering resistive elements.

18. A PLL system according to claim 1, wherein said at least one variable element comprises:
  a plurality of resistive elements connected in series between a voltage reference and said controlled oscillator; and
  a plurality of switching devices, with each switching device being connected across a respective resistive element and being driven by a respective driving signal.

19. A PLL system according to claim 18, wherein the respective driving signals are obtained by combining the driving signal with a multiplication factor.

20. A PLL system according to claim 18, further comprising a multi-level decider for providing the respective driving signals.

21. A PLL system according to claim 1, wherein said at least one variable element comprises:
  first and second capacitors;
  first and second switching devices respectively being driven by the driving signal and an inverse thereof for setting a capacitance for said controlled oscillator and for changing at least one operating parameter of the PLL system.

22. A phase-locked loop (PLL) system comprising:
  at least one phase detector;
  a low-pass filter connected to said at least one phase detector;
  a controlled oscillator connected to said low-pass filter;
  a frequency divider connected between an output of said controlled oscillator and a first input of said at least one phase detector; and
  an automatic frequency range selection device connected between said controlled oscillator and a second input of said at least one phase detector without being connected to said frequency divider, said automatic frequency range selection device comprising
    an edge detector having an input connected to the second input of said at least one phase detector for receiving the input signal, a control circuit connected to said edge detector for generating a driving signal based upon a frequency estimate of an input signal applied to the second input of said at least one phase detector, and at least one variable element being driven by the driving signal for calibrating the PLL system and for matching operation of the PLL system to a frequency range of the input signal.

23. A PLL system according to claim 22, wherein said at least one variable element matches operation of the PLL system to a frequency range of the input signal.

24. A PLL system according to claim 22, wherein said at least one variable element comprises:

a switching device being driven by the driving signal; and a plurality of resistive elements connected in series, and at least one of said resistive elements has its terminals connected to said switching device.

25. A PLL system according to claim 22, further comprising an output transistor connected between said controlled oscillator and said at least one variable element; and wherein said at least one variable element comprises:

first and second resistive elements connected in series between a voltage reference and said output transistor; and a switching device connected across one of said first and second resistive elements and being driven by the driving signal for selecting a resistance of at said at least one variable element by shorting one of said first and second resistive elements based upon said switching device being closed.

26. A PLL system according to claim 22, wherein said at least one variable element comprises an additional variable element defining a filtering resistive element in said low-pass filter, said additional variable element being driven by the driving signal.

27. A PLL system according to claim 26, wherein said additional variable element comprises:

first and second filtering resistive elements connected in series; and a switching device connected across one of said first and second filtering resistive elements.

28. A PLL system according to claim 22, wherein said at least one variable element comprises:

a plurality of resistive elements connected in series between a voltage reference and said controlled oscillator; and a plurality of switching devices, with each switching device being connected across a respective resistive element and being driven by a respective driving signal.

29. A PLL system according to claim 22, wherein said at least one variable element comprises:

first and second capacitors;

first and second switching devices being driven by the driving signal and an inverse thereof for setting a capacitance for said controlled oscillator and for changing at least one operating parameter of the PLL system.

30. A PLL system according to claim 22, wherein said edge detector provides a set signal to said control circuit for indicating edges of the input signal; and wherein said control circuit comprises:

a generator connected to a first voltage reference for generating a reference current;

a sense capacitor connected between said generator and a second voltage reference; and an electronic switch connected across said sense capacitor and being driven by the set signal.

31. A PLL system according to claim 30, wherein said sense capacitor is reset by the set signal at the rising/falling edges of the input signal and is charged by the reference current, whereby a frequency of the input signal is indicated by a voltage across said sense capacitor.

32. A PLL system according to claim 30, wherein said control circuit further comprises:

a comparator having a first input connected to said sense capacitor;

a threshold selector connected to a second input of said comparator and comprising first and second switches, said threshold selector having a first input for receiving a first threshold via said first switch and a second input for receiving a second threshold via said second switch, the first switch being driven by the driving signal and the second switch being driven by an inverse of the driving signal.

33. A PLL system according to claim 32, wherein said control circuit further comprises:

a sampler circuit connected to an output of said comparator and being driven by a signal provided by said edge detector; and a majority decision block connected to said sampler circuit for providing the driving signal to said at least one variable element.

34. A PLL system according to claim 33, wherein said sampler circuit comprises a plurality of cascaded flip-flops receiving an output signal from said comparator, and receiving at a set terminal the signal provided by said rising/falling edge detector.

35. A method of automatically calibrating a phase locked loop (PLL) system comprising at least one switch connected to at least one resistor, the method comprising:

estimating a frequency of an input signal being applied to the PLL system;

generating a driving signal for driving the at least one switch connected to the at least one resistor based upon the estimated frequency; and calibrating the PLL system using the at least one switch being driven by the driving signal.

36. A method according to claim 35, wherein the PLL system has a transfer function associated therewith; and wherein the calibrating comprises adjusting parameters of the PLL system that are related to the transfer function.

37. A method according to claim 35, wherein estimating the frequency of the input signal comprises converting the frequency of the input signal into a comparable parameter.

38. A method according to claim 37, wherein the PLL system comprises a sense capacitor; wherein the comparable parameter comprises a voltage across the sense capacitor; and further comprising discharging the sense capacitor at rising/falling edges of the input signal.

39. A method according to claim 38, wherein generating the driving signal provides a comparison of the voltage across the sense capacitor with at least one threshold.

40. A method according to claim 37, further comprising:

generating a reference clock signal using a clock counter;

counting pulses of the reference clock signal; and resetting the clock counter based upon the rising/falling edges of the input signal.

41. A method according to claim 35, wherein the resistive value is selected within a range that corresponds to an operating frequency range of the PLL system.

42. A method according to claim 41, wherein the range of resistive values is split into at least two sub-ranges that partially overlap.

43. A method according to claim 35, wherein the PLL system comprises at least one capacitor; and wherein the calibrating comprises selecting a capacitive value of the at least one capacitor.

44. A method according to claim 35, wherein the PLL system comprises at least one current generator providing a current; and wherein the calibrating comprises selecting a value of the current.

* * * * *

UNITED STATES PATENT AND TRADEMARK OFFICE
CERTIFICATE OF CORRECTION

PATENT NO.    : 6,816,019 B2
DATED         : November 9, 2004
INVENTOR(S)   : Simona Delbo', Ernesto Lasalandra and Fabio Pasolini It is certified that error appears in the above-identified patent and that said Letters Patent is hereby corrected as shown below:

<u>Column 3,</u>
Line 51, delete "$K_{VCO} = 2.9E^{10} H \frac{Hz}{A}$" insert -- $K_{VCO} = 2.9E^{10} \frac{Hz}{A}$ --

Signed and Sealed this

Twelfth Day of April, 2005

JON W. DUDAS
*Director of the United States Patent and Trademark Office*